(12) United States Patent
Gartland et al.

(10) Patent No.: US 7,875,119 B2
(45) Date of Patent: Jan. 25, 2011

(54) APPARATUS AND METHOD FOR COATING AN ARTICLE

(75) Inventors: Mathew Gartland, Trumbull, CT (US); Mark A. Livings, East Windsor, CT (US)

(73) Assignee: United Technologies Corporation, Hartford, CT (US)

( * ) Notice: Subject to any disclaimer, the term of this patent is extended or adjusted under 35 U.S.C. 154(b) by 1858 days.

(21) Appl. No.: 10/956,440

(22) Filed: Oct. 1, 2004

(65) Prior Publication Data

US 2006/0070573 A1    Apr. 6, 2006

(51) Int. Cl.
*C23C 16/00* (2006.01)
*C23C 16/455* (2006.01)

(52) U.S. Cl. ...................................... 118/719; 118/715
(58) Field of Classification Search .................. 118/715, 118/719
See application file for complete search history.

(56) References Cited

U.S. PATENT DOCUMENTS

| 4,096,296 | A | * | 6/1978 | Galmiche et al. ........... 427/247 |
| 4,148,275 | A | * | 4/1979 | Benden et al. .............. 118/715 |
| 5,071,678 | A | | 12/1991 | Grybowski |
| 5,221,354 | A | * | 6/1993 | Rigney ....................... 118/725 |
| 5,308,399 | A | * | 5/1994 | Pillhoefer et al. ........... 118/719 |
| 5,503,677 | A | * | 4/1996 | Morsen et al. .......... 118/723 R |
| 5,507,306 | A | * | 4/1996 | Irvine et al. ............. 134/166 R |
| 5,910,219 | A | * | 6/1999 | Perry et al. ................. 118/719 |
| 5,928,725 | A | * | 7/1999 | Howard et al. .............. 427/237 |
| 6,039,810 | A | * | 3/2000 | Mantkowski et al. ....... 118/715 |
| 6,332,926 | B1 | | 12/2001 | Pfaendtner |
| 2006/0070573 | A1 | * | 4/2006 | Gartland et al. ............ 118/715 |

FOREIGN PATENT DOCUMENTS

JP           01-159376     *   6/1989

* cited by examiner

*Primary Examiner*—Jeffrie R Lund
(74) *Attorney, Agent, or Firm*—Carlson, Gaskey & Olds

(57) ABSTRACT

A coating apparatus includes a mounting member for mounting a turbine airfoil in a coating chamber. The mounting member defines a chamber therein and includes a mounting port that is adapted to receive the turbine airfoil. The mounting port provides a fluid connection between the chamber and an internal passage of the airfoil. A support member is mounted between the chamber wall and mounting member and bears the weight of the mounting member. The mounting member is unfixed relative to a chamber wall of the coating chamber. Thus, the chamber wall does not restrict the mounting member during thermal expansion and contraction of the mounting member and avoids warping of the mounting member.

19 Claims, 2 Drawing Sheets

APPARATUS AND METHOD FOR COATING AN ARTICLE

BACKGROUND OF THE INVENTION

The present invention relates to a coating apparatus, and more particularly to a coating chamber for depositing a coating on a surface of an internal air passage of an aerospace component.

A conventional aircraft gas turbine engine generally expands hot combustion gases against shaft-mounted turbine airfoils to rotate the shaft and power a fan and a compressor. A combination of high temperatures and combustion products in the hot combustion gases produces a severe corrosive and oxidative environment for the turbine airfoils. Conventional turbine airfoils employ internal air passages to cool the turbine airfoil. Airflow through the internal air passages carries heat away from the interior of the turbine airfoil. Typical turbine airfoils also employ coatings, such as aluminide coatings, on the surfaces of the internal air passages and exterior of the turbine airfoils to protect the turbine airfoil against corrosion and oxidation that may otherwise decrease the life of the turbine airfoil.

The coatings are typically deposited on the internal surfaces of the internal air passages using a chemical vapor deposition (CVD) process carried out at temperatures on the order of 2000° F. inside a coating chamber. The turbine airfoils are typically each mounted vertically on a hollow mounting boss in the coating chamber, which are welded along with gas supply pipes to walls of the coating chamber. The hollow mounting bosses provide flow paths into to the internal air passages of the turbine airfoils. During the CVD process, a coating chemical flows through the internal passage and coats the internal passage.

Disadvantageously, the coating chamber, mounting bosses, and gas supply pipes may warp after only a few coating cycles because of thermal expansion and contraction, i.e., thermal stress. The warping may cause the turbine airfoils to mount at an angle relative to the vertical position and may disrupt the flow of the coating chemical, thus causing uneven distribution of the coating on the internal air passage surfaces. The warping may also cause leakage of the coating chemical from the hollow mounting bosses. Sealing gaskets have been employed between the turbine airfoil and mounting bosses to counteract the leaking, however, the sealing gaskets are often unreliable and leaking can continue and further contribute to uneven coating distribution. The uneven coating distribution may ultimately result in a low yield of acceptably coated turbine airfoils and/or having to replace the coating chamber.

Accordingly, there is a need for a robust CVD coating chamber that does not warp and avoids the shortcomings and drawbacks of the prior art.

SUMMARY OF THE INVENTION

The coating apparatus according to the present invention includes a first chamber disposed in a second chamber. A turbine airfoil is mounted in a gas flow path between the first chamber and second chamber. A gas in the first chamber flows into an internal passage of the turbine airfoil and deposits a coating on a surface of the internal passage. The gas exits the internal passage and flows into the second chamber to deposit a coating on an exterior surface of the turbine airfoil.

Another coating apparatus example includes a mounting member for mounting the turbine airfoil in a coating chamber. The mounting member defines a chamber therein and includes a mounting port that is adapted to receive the turbine airfoil. The mounting port provides a fluid connection between the chamber and an internal passage of the airfoil. A chamber access port cap is removably engaged with the mounting member and provides access to the chamber. A gas tube is positioned adjacent to the mounting member in a milled out groove in the mounting member and includes spaced apart perforations that fluidly connect the gas tube and the chamber to a remote gas source. A support member mounted between the chamber wall and mounting member bears the weight of the mounting member. The mounting member is unfixed relative to a chamber wall of the coating chamber. Thus, the chamber wall does not restrict the mounting member during thermal expansion and contraction of the mounting member, avoiding warping.

In another coating apparatus example, an end of the mounting member contacts the chamber wall or is secured to the chamber wall, while the other end of the mounting member is not secured to the chamber wall. In such a configuration, the chamber wall does not significantly restrict the end and warping is avoided.

In another coating apparatus example, the coating chamber includes like mounting members that each include a plurality of mounting ports. The gas tube fluidly connects the chambers of the like mounting members to a remote gas source. The like mounting members are either unfixed relative to the chamber wall or have an end that contacts the chamber wall and an end that is not secured to the chamber wall to avoid warping.

The present invention provides a robust coating apparatus that includes a chamber wall that does not restrict thermal expansion and contraction of a mounting member during a chemical vapor deposition process.

BRIEF DESCRIPTION OF THE DRAWINGS

The various features and advantages of this invention will become apparent to those skilled in the art from the following detailed description of the currently preferred embodiment. The drawings that accompany the detailed description can be briefly described as follows.

DETAILED DESCRIPTION OF THE PREFERRED EMBODIMENT

Figure 1:
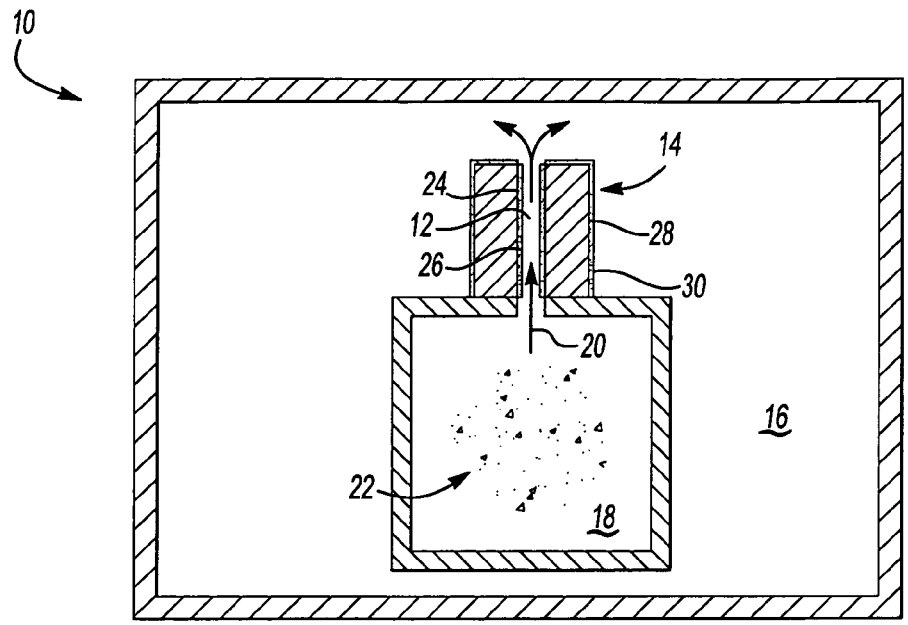
FIG. 1 illustrates a schematic cross-sectional view of an exemplary coating apparatus used to coat an internal passage of an airfoil.

FIG. 1 illustrates a schematic cross-sectional view of an exemplary coating apparatus 10 for coating an internal passage 12 of a turbine airfoil 14 or other component. The coating apparatus 10 includes a first coating chamber 16 and a second coating chamber 18 disposed in the first coating chamber 16. The turbine airfoil 14 is mounted in a flow path 20 between the first coating chamber 16 and second coating chamber 18.

In the coating process, a gas 22 such as argon or other inert gas in the second coating chamber 18 flows into the internal passage 12 of the turbine airfoil 14. The gas 22 includes a precursor coating chemical, such as an aluminide precursor. The gas 22 deposits the precursor coating chemical on a surface 24 of the internal passage 12, thus forming a coating 26 on the surface 24. Preferably, the coating 26 is an aluminide coating, however, other types coatings may also be deposited. The gas 22 and the remaining precursor coating chemical exit the internal passage 12 and flow into the first coating chamber 16. In the first coating chamber 16, the gas 22 and remaining precursor coating chemical contact an exterior surface 28 of the turbine airfoil 14 and deposit a coating 30 on the exterior surface 28 of the turbine airfoil 14.

Figure 2:
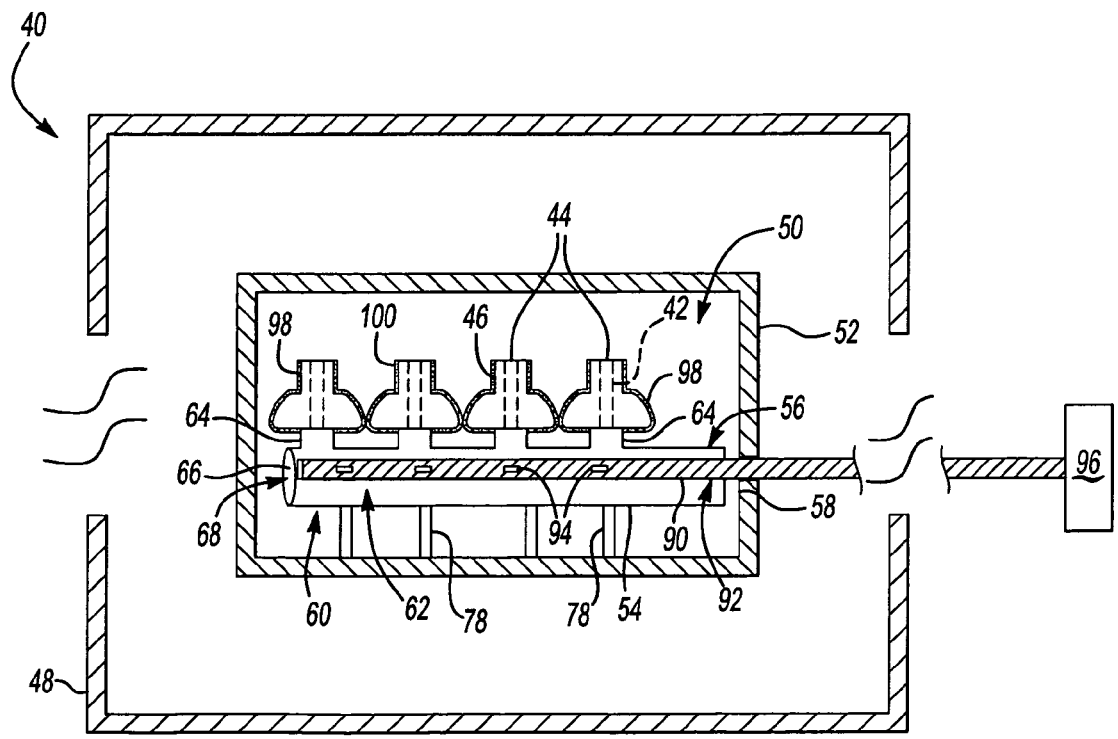
FIG. 2 illustrates a schematic cross-sectional view of another exemplary coating apparatus configuration used to coat the internal passage of the airfoil.

FIG. 2 illustrates a schematic cross-sectional view of another exemplary coating apparatus 40 used to coat an internal passage 42 of an airfoil 44 or other component. The coating apparatus 40 is generally utilized to deposit an aluminide coating or other type of coating on a surface 46 of the internal passage 42 at an elevated coating temperature. In one example, the coating temperature is approximately 2000° F., however, the coating apparatus 40 may be utilized with other coating temperatures.

The coating apparatus 40 includes a retort heating chamber 48 and a coating chamber 50. The coating chamber 50 is locatable in the retort heating chamber 48 for a coating process and is removable from the retort heating chamber 48 for positioning of the airfoils 44 in the coating chamber 50.

The coating chamber 50 includes a chamber wall 52 that surrounds a mounting member 54. The chamber wall 52 may be of a variety of different shapes and constructions, including but not limited to square/rectangular, rounded, a multi-piece construction, and a single piece construction. The mounting member 54 is unfixed relative to the chamber wall 52. That is, the mounting member 54 is not attached to or in direct contact with the chamber wall 52 and thus is not restricted by the chamber wall 52 during thermal expansion and contraction of the mounting member 54. The mounting member 54 therefore may expand and contract independent of the chamber wall 52, thereby avoiding warping due to thermal stress from the chamber walls 52. Minimal warping may still occur from thermal stresses induced internally in the mounting member 54.

Alternatively, an end 56 of the mounting member 54 may contact the chamber wall 52 or be secured at a surface 58 to the chamber wall 52, while the other end 60 of the mounting member 54 is not secured to the chamber wall 52. In such an example, the mounting member 54 is not significantly restricted by the chamber wall 52, and thus is able to thermally expand and contract essentially independently of the chamber wall 52.

Figure 3:
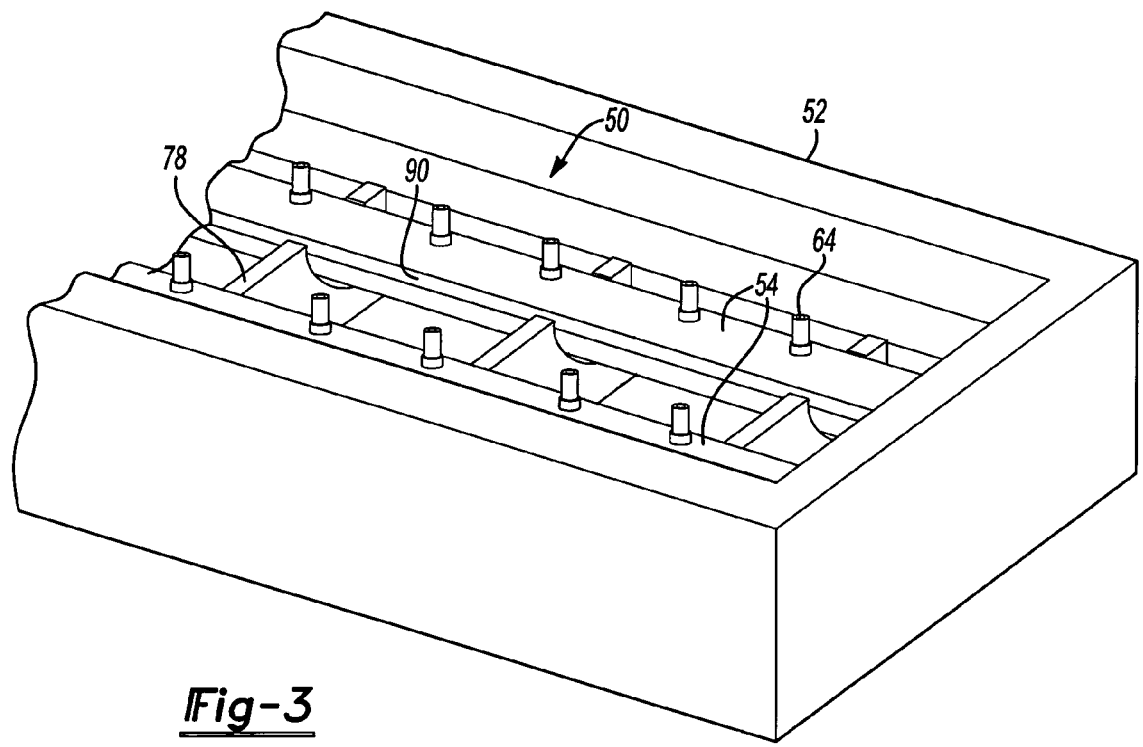
FIG. 3 illustrates a perspective view of the exemplary coating apparatus configuration of FIG. 2.

The mounting member 54 has a cylindrical tube shape and defines a chamber 62 therein. A cylindrically-shaped mounting port 64 extends essentially perpendicularly from the mounting member 54 and is adapted to receive a corresponding mating portion of the airfoil 44. The mounting port 64 provides a fluid connection between the chamber 62 and the internal passage 42 of the airfoil 44. Preferably, the mounting member 54 includes a plurality of like mounting ports 64 to enable coating of a plurality of airfoils 44. Even more preferably, the coating chamber 50 includes a plurality of like mounting members 54 that each includes a plurality of mounting ports 64, as best illustrated in the example in FIG. 3.

A chamber access port cap 66 is removably engaged with the mounting member 54 and provides access to the chamber 62 through an opening 68. Although a particular location of the chamber access port cap 66 is shown, the chamber access port cap 66 may be located in other locations along the mounting member 54.

A support member 78, such as a gusset or other support, is mounted between the chamber wall 52 and mounting member 54 and bears at least a portion of the weight of the mounting member 54.

Figure 4:
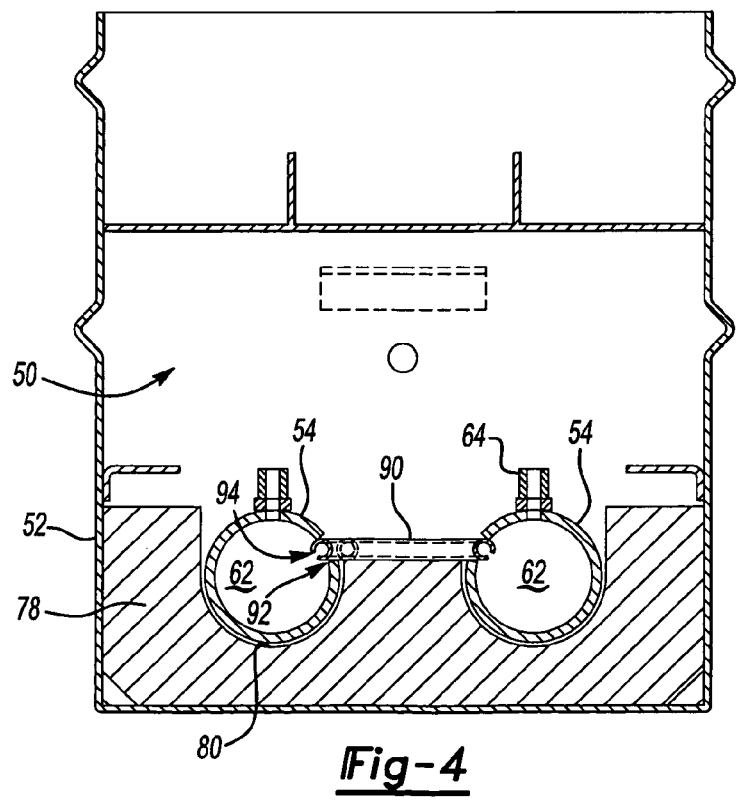
FIG. 4 illustrates another cross-sectional view of the exemplary coating apparatus configuration of FIG. 2.

As illustrated in FIG. 4, the support member 78 includes an opening 80 having a shape that corresponds to the cross-sectional shape of the mounting member 54. The opening 80 cradles the mounting member 54 and generally prevents lateral movement of the mounting member 54, but is not attached to the mounting member 54. In other examples, the support member 78 may be secured to the mounting member 54 or the chamber wall 52. Preferably, a plurality of support members 78 bear the weight of the mounting member 54.

A gas tube 90 is secured to the mounting member 54 in a milled out groove 92 located along the mounting member 54. Preferably, the gas tube 90 is secured by welding, although other methods of securing may be used. The milled out groove 92 extends into the chamber 62 such that spaced apart perforations 94 in the gas tube 90 fluidly connect the gas tube 90 and the chamber 62. The gas tube 90 provides a fluid connection between a remote gas source 96 and the chamber 62. Preferably, the spaced apart perforations 94 are evenly spaced from each other along the gas tube 90 such that gas flow from the remote gas source 96 is uniformly distributed through the spaced-apart perforations 94 into the chamber 62. In examples that utilize a plurality of mounting members 54, the gas tube 90 may additionally provide a fluid connection between the chambers 62 of the plurality of mounting members 54, as illustrated in the cross-sectional view of FIG. 4.

Operationally, the chamber access port cap 66 is removed and an aluminide precursor chemical, for example, is positioned in the chamber 62. After replacing the chamber access port cap 66, the coating chamber 50 is positioned in the retort heating chamber 48 and heated to an elevated coating temperature, for example 2000° F. The remote gas source 96 supplies a carrier gas, such as argon or other inert gas, through the gas tube 90. The carrier gas flows through the spaced-apart perforations 94 into the chamber 62, through the mounting ports 64, through the internal passages 42 of the airfoils 44, and into the coating chamber 50. At or near the elevated coating temperature, the aluminide precursor chemical gasifies. The carrier gas carries the gasified aluminide precursor chemical through the mounting ports 64 and the internal passages 42. The aluminide precursor chemical is deposited as a thermal barrier layer coating 98 on the surfaces 46 of the internal passages 42. The carrier gas and the remaining gasified aluminide precursor chemical exit the internal passages 42 and enter the coating chamber 50. The carrier gas deposits the thermal barrier layer coating 98 on exterior portions 100 of the airfoils 44 before venting into the retort heating chamber 48. Alternatively, some or all of the exterior portions may be masked to prevent deposition thereon.

It should be understood that although a particular component arrangement is disclosed in the illustrated embodiment, other arrangements will benefit from the instant invention.

Although particular step sequences are shown, described, and claimed, it should be understood that steps may be performed in any order, separated or combined unless otherwise indicated and will still benefit from the present invention.

Although a preferred embodiment of this invention has been disclosed, a worker of ordinary skill in this art would recognize that certain modifications would come within the scope of this invention. For that reason, the following claims should be studied to determine the true scope and content of this invention.

We claim:

1. An apparatus for coating internal passages of a component, the apparatus comprising:
   a first coating chamber;
   a second coating chamber disposed in said first coating chamber;
   a mounting member having a port including a flow path that fluidly connects said first coating chamber and said second coating chamber, said port being adapted to receive the component; and
   a support member between said mounting member and said first coating chamber, wherein said support member detachably supports said mounting member.

2. The apparatus as recited in claim 1, wherein said first coating chamber surrounds said second coating chamber.

3. The apparatus as recited in claim 1, wherein said second coating chamber is unsecured to said first coating chamber.

4. The apparatus as recited in claim 1, wherein the component is a turbine airfoil, and said port is adapted to receive the turbine airfoil in said flow path.

5. The apparatus as recited in claim 1, wherein said first coating chamber comprises a chamber wall and second coating chamber is unfixed relative to said chamber wall.

6. The apparatus as recited in claim 1, wherein said second chamber includes a first end and a second end, and said first end is fixed relative to said first coating chamber and a second end is unfixed relative to said first coating chamber.

7. The apparatus as recited in claim 1, wherein said support member is located between said first coating chamber and said second coating chamber, and said support member bears at least a portion of a weight of said second coating chamber.

8. The apparatus as recited in claim 1, wherein said second coating chamber is one of a plurality of like coating chambers disposed in said first coating chamber.

9. The apparatus as recited in claim 1, comprising a flow channel in fluid communication with said second coating chamber.

10. The apparatus as recited in claim 1, wherein said mounting member defines the second coating chamber therein and includes a cylindrical tube that defines said chamber.

11. The apparatus as recited in claim 10, wherein said mounting port is one of a plurality of mounting ports that each include a cylindrical boss that extends from said cylindrical tube.

12. The apparatus as recited in claim 10, comprising a chamber access port and a cap removably engaged with said chamber access port.

13. The apparatus as recited in claim 10, comprising a flow channel adjacent to said chamber, said flow channel including at least one conduit fluidly connecting said flow channel and said chamber.

14. The apparatus as recited in claim 1, comprising at least one pair of second coating chambers fluidly connected by a conduit.

15. The apparatus as recited in claim 1, comprising a plurality of pairs of second coating chambers aligned to form a first row of second coating chambers, and a second row of coating chambers that is parallel to the first row of coating chambers.

16. The apparatus as recited in claim 15, wherein each of said pairs of second coating chambers is fluidly connected by a conduit.

17. The apparatus as recited in claim 1, wherein said mounting member defines a chamber having a plurality of perforations to fluidly connect said second chamber with a source of coating material.

18. The apparatus as recited in claim 1, wherein said support member includes an opening having a shape that corresponds to a cross-sectional shape of said mounting member.

19. The apparatus as recited in claim 1, wherein said support member has at least one opening that at least partially receives said mounting member.

\* \* \* \* \*